(12) United States Patent
Kloppenburg

(10) Patent No.: US 11,688,974 B2
(45) Date of Patent: Jun. 27, 2023

(54) TEST PLUG BLOCK AND TEST TERMINAL BLOCK

(71) Applicant: Phoenix Contact GmbH & Co. KG, Blomberg (DE)

(72) Inventor: Christian Kloppenburg, Büren Wewelsburg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 124 days.

(21) Appl. No.: 17/262,765

(22) PCT Filed: Jul. 25, 2019

(86) PCT No.: PCT/EP2019/069994
§ 371 (c)(1),
(2) Date: Jan. 25, 2021

(87) PCT Pub. No.: WO2020/020988
PCT Pub. Date: Jan. 30, 2020

(65) Prior Publication Data
US 2021/0313739 A1     Oct. 7, 2021

(30) Foreign Application Priority Data

Jul. 27, 2018  (BE) .................................. 2018/5542

(51) Int. Cl.
*H01R 13/627*   (2006.01)
*G01R 1/04*   (2006.01)
(Continued)

(52) U.S. Cl.
CPC ....... *H01R 13/6275* (2013.01); *G01R 1/0416* (2013.01); *H01R 13/62944* (2013.01);
(Continued)

(58) Field of Classification Search
CPC .... H01R 9/26; H01R 9/2666; H01R 2201/20; H01R 13/627; H01R 13/6275; H01R 13/629; H01R 13/62944; H05K 5/0217; H05K 5/0221; H05K 7/1401; H05K 7/1402
See application file for complete search history.

(56) References Cited

U.S. PATENT DOCUMENTS 2,987,693 A * 6/1961 Wamsley ......... H01R 13/62933
439/157
7,666,037 B2   2/2010 Diessel
(Continued)

FOREIGN PATENT DOCUMENTS

DE   202011051798 U1   2/2013

*Primary Examiner* — Oscar C Jimenez
(74) *Attorney, Agent, or Firm* — David S. Safran; Calderon Safran & Cole P.C.

(57) ABSTRACT

A test plug block (1) for plugging onto a series terminal block (2), comprising a plurality of test plugs (4) connected to one another and two fastening parts (5), which are arranged on both sides of the plurality of test plugs (4) and are connected to one another by means of a grip piece (6), the fastening parts (5) each having a housing (7) and an insertion portion (8), which can be inserted into a receiving portion (9), the receiving portion (9) being formed in the clamp housing (10) of a fastening clamp (11) of the series terminal block (2).

16 Claims, 9 Drawing Sheets

(51) Int. Cl.
   *H01R 13/629* (2006.01)
   *H05K 5/02* (2006.01)
   *H05K 7/14* (2006.01)

(52) U.S. Cl.
   CPC ......... *H05K 5/0217* (2013.01); *H05K 7/1401* (2013.01); *H01R 2201/20* (2013.01)

(56) References Cited

U.S. PATENT DOCUMENTS

| | | |
|---|---|---|
| 9,620,898 B2 | 4/2017 | Kloppenburg |
| 2015/0077149 A1* | 3/2015 | Kloppenburg ......... H01R 31/08 324/754.03 |
| 2020/0006893 A1* | 1/2020 | Ding ................... G02B 6/3879 |

\* cited by examiner

TEST PLUG BLOCK AND TEST TERMINAL BLOCK

BACKGROUND OF THE INVENTION

Field of the Invention

The invention relates to a test plug block for plugging onto a series terminal block, with a number of test plugs that are connected to one another and two fastening parts that are arranged on both sides of the number of test plugs, which fastening parts are connected to one another via a grip piece, wherein the fastening parts in each case have a housing and an insertion section, which can be inserted into a receiving section, wherein the receiving section is formed in the clamp housing of a fastening clamp of the series terminal block.

Moreover, the invention relates to a test terminal block that comprises a series terminal block and a test plug block that can be plugged onto the empty series terminal block, wherein the series terminal block has a number of series terminals that are arranged one next to the other with a respective fastening clamp on each side of the number of series terminals, wherein the test plug block has a number of test plugs that are connected to one another and a respective fastening part on each side of the number of test plugs, wherein the two fastening parts are connected to one another via a grip piece, wherein the fastening parts in each case have a housing and an insertion section, which can be inserted into a receiving section, wherein the receiving section is formed in the clamp housing of a fastening clamp of the series terminal block.

Description of the Related Art

Electrical series terminals have been known for decades now and have been used in the millions in the wiring of electrical units and devices. In most cases, the clamps are snapped onto support rails, a number of which in turn are frequently arranged in a switch cabinet. In the switching, cutting, and regulating fields, disconnect-option through clamps are the standard. The disconnect option provided in the case of such through clamps by the formation of a cut point in the current bar makes it possible in this case to insert various plugs with various functions into the clamp housing of the series terminals, which then make contact with the current bar at the cut point. As plugs, in this case in addition to simple partition plugs or through connectors, in particular, it is also possible to use test plugs, which can have special components and make it possible to check the proper function of the circuit that is connected to the series terminal.

Electrical series terminals, which are in general designed in the shape of a disk, are frequently plugged together with multiple other electrical series terminals to form a series terminal block and snapped onto a support rail or mounted in a wall section, for example, a switch cabinet. Accordingly, the individual test plugs, which in their width generally correspond to the width of the series terminals, are also connected to a test plug block and together are mounted on a corresponding series terminal block. In this case, the requirement exists that the number of series terminals that are connected to one another, and the number of test plugs that are combined with one another to form a test plug block, is freely selectable. At the same time, however, the test plugs that are combined to form a test plug block are to be actuated together as simply as possible, i.e., they can be mounted together onto the series terminal block.

In order to ensure contact states that are defined when the test plug is inserted into the test opening, the current bars are designed in the case of the electrical series terminal known from German Patent Application 10 2006 052 894 A1 and corresponding U.S. Pat. No. 7,666,037 B2 in such a way that they form two contact areas, which are arranged one behind another in the plug-in direction of a test plug. In the case of the known series terminals, the cut point that is formed from one end area of the busbars is thus formed in two stages. By the forming of a defined second contact area, which is arranged in the insertion direction of the contact plug in front of the first contact area, it is ensured that when the contact plug is inserted, first a more secure electrical connection between the contact plug and the two current bars is created, before the first contact area is opened with further insertion of the contact plug, by which the two current bars are then electrically separated from one another. In the above-described series terminals or test terminal blocks, the two current bars make contact with one another, so that the line terminal elements are connected to one another in an electrically conductive manner when no plug is inserted into the series terminal. If, however, a plug is inserted (completely) into the series terminal, the contact area is separated, so that the line terminal elements are also separated from one another electrically.

Frequently, the individual test plugs of the test plug block have contact plugs of different lengths. When the test plug block is plugged in, the longer contact plugs of individual test plugs are then first inserted into the corresponding openings in the clamp housing of the series terminals and there make contact with the first leading contact area of the two current bars in the plug-in direction of the test plug. If the test plug block is then plugged onto the series terminal block, the longer contact plugs are inserted into the second contact area, by which this contact area is opened, so that the electrically conductive connection between the two current bars—and thus also between the two line terminal elements that are connected to the current bars—is interrupted. If the contact plugs are electrically conductive, the current over the test plug is thus diverted. If the test plug block is then plugged onto the series terminal block, the shorter contact plugs next make contact initially corresponding to the leading contact area in the series terminals, before the shorter contact plugs also open the second contact area, and thus also the current of these series terminals is interrupted and optionally is diverted over the test plugs.

When the test plug block is extracted from the series terminal block, in many applications, it is necessary or at least desirable for the longer contact plugs still to separate the contact area of the assigned series terminals, while the shorter contact plugs are already pulled out from the second contact area of the assigned series terminals, so that the two current bars of the corresponding series terminals make contact again, thus ensuring that the current runs over the series terminals. In this case, in the known test terminal blocks, there is still the danger that, because of too quick or uneven removal of the test plug block from the series terminal block, the above-described sequence—according to which the contact areas of a few series terminals are still opened by the longer contact plugs, while over other series terminals to which test plugs with shorter contact plugs are assigned a current transfer is already taking place—will not be reliably or perfectly ensured. This may give rise to an unstable or undefined electronic state of individual series terminals of the series terminal block.

It is known from German Patent Application DE 10 2013 019 066 A1 and corresponding U.S. Pat. No. 9,620,898 B2 to provide at least two latching elements, which determine a first and second latching position of the test plug block, to ensure a two-stage extraction of the test plug block from a series terminal block, wherein the individual latching positions can be released individually by moving an unlocking element. In this case, the unlocking element is connected to the grip piece in such a way that a turn of the grip piece produces a straight-line motion of the unlocking element. For complete unlocking of the test plug block, the grip piece is turned initially by a first angle α, then by a second angle β, and then back into the basic position.

SUMMARY OF THE INVENTION

Starting from this state of the art, the object of this invention is to indicate a test plug block and a test terminal block, which ensures an especially simple and comfortable handling for the mechanic both when inserting and unlocking or extracting the test plug block from a series terminal block.

This object is achieved with the test plug block in accordance with the invention in that a locking element is arranged in the insertion section of at least one fastening part, which locking element can be brought from a basic position into an unlocking position by turning the grip piece. The locking element has a first connecting element in the form of a locking hook or a locking projection, wherein the first connecting element together with a corresponding second connecting element in the form of a locking projection or a locking hook in the clamp housing of the at least one fastening clamp determines a first locking position. In addition, the locking element has at least one stop surface, wherein the stop surface together with an opposing stop surface in the clamp housing of the at least one fastening clamp in the unlocking position of the locking element prevents the test plug block from being pulled out.

In principle, the insertion section can be configured in one piece with the housing of the fastening part, or the insertion section can be directly or indirectly connected to the housing as a separate element.

According to the invention, it was found that a multi-stage extraction of the test plug block from a series terminal block can be carried out especially simply in that the locking element can be adjusted between two positions, namely the basic position and the unlocking position, in that a first locking state is achieved in the basic position, and in that a second locking state is achieved in the unlocking position. In this case, within the scope of this invention, the basic position and the unlocking position are defined by the position of the locking element.

Advantageously, an unlocking of the second locking state, which is determined by the stop of the stop surface at the opposing stop surface, wherein the test plug block is already pulled out by a defined distance from the series terminal block, is especially simply achieved in that the locking element is brought again into the basic position. This can occur especially in that the force that acts on the grip piece is released; alternatively, the grip piece can also be actively turned back.

To transfer the turning motion of the grip piece to the locking element, the locking element is preferably indirectly connected to the grip piece, i.e., via at least one additional transfer element.

The handling of the test plug block, in particular when it is unlocked and extracted from a series terminal block, is thus especially comfortable for the mechanic and can easily be done even with one hand.

Preferably, the locking element has at least one additional stop surface, which together with another opposing stop surface in the clamp housing of the fastening clamp ensures that the motion of the locking element does not go beyond the basic position. This is relevant in particular when the locking element is brought from the second locking position back into the basic position. In addition, this configuration has the advantage that an accidental tilting of the locking element, which could result in a canting of the test plug block, can be prevented. According to an especially simple configuration, the additional opposing stop surface is produced by the second connecting element.

According to a next configuration, the locking element has a guiding projection on the side facing away from the housing, wherein in addition, the insertion section has a guiding surface, wherein the guiding projection is arranged to move in the guiding surface, so that the guiding surface limits the motion of the locking element to the area between the basic position and the unlocking position and/or the locking element is kept in position by means of the guiding projection and the guiding surface. The presence of such a guiding surface also ensures that the locking element cannot be moved out over the basic position or over the unlocking position. Also, this configuration thus has the advantage that an undesirable canting can be prevented. In addition, this configuration prevents a motion of the locking element in the direction of the test plug. According to one configuration, the guiding surface is [stet] as a groove that engages with the guiding projection.

According to a next advantageous configuration, a lever element is arranged in the housing of at least one fastening part, wherein the lever element is connected to the locking element, and wherein the locking element can be brought from the basic position into the unlocking position by the grip piece being turned by means of the lever element. This configuration has the advantage that because of the use of the lever element, little force need be expended to position the locking element.

According to one configuration, the lever element and the locking element are configured in one piece.

Especially preferably, the lever element and the locking element are arranged to turn to one another, wherein the lever element has a guide element, wherein the locking element can be brought from the basic position into the unlocking position in the case of a motion of the lever element by turning the grip piece by the guide element. According to this configuration, the lever element and the locking element in principle also can be moved independently of one another. The guide element ensures, however, that by turning the grip piece, there is a transfer of motion of the lever element directly onto the locking element in such a way that the latter is brought from the basic position into the unlocking position. Especially preferably, the guide element is simultaneously configured and arranged in such a way that it also steers the motion of the locking element back into the basic position and/or stabilizes the locking element in the basic position. According to an especially simple configuration, the guide element is configured as a stop between the lever element and the locking element.

According to a next preferred configuration, the lever element has a rotationally-symmetrical receiving area, wherein the locking element has a rotationally-symmetrical fastening area, which is arranged in the receiving area of the lever element, wherein the fastening area of the locking element is held in the receiving area of the lever element preferably by means of at least one latching catch. This configuration of the connection of the lever element to the locking element has the advantage that an especially large margin of an independent motion of the locking element is provided. Especially preferably, the fastening area of the locking element is arranged in the receiving area of the lever element in such a way that a common axis of rotation is present.

An especially compact arrangement can thus be produced in that the lever element is configured and arranged in such a way that a motion of the lever element by the grip piece produces a rotation of the receiving area.

In addition, it is advantageous when a spring element is arranged between the locking element and the lever element in such a way that the locking element is brought by the force of the spring into the basic position when the grip piece is not actuated and/or the test plug block is completely inserted, so that the locking element is arranged in the first locking position. In particular, it can be ensured that the locking element is always brought back into the basic position even after force is applied to the grip piece. In principle, it is also ensured advantageously by such a spring element that the locking element is held in a stable position relative to the lever element. Such a spring element can be configured, for example, as a compression spring or as a tension spring.

According to a next configuration, the locking element and the lever element are connected to one another in such a way that the locking element has a range of motion so that during the insertion process of the test plug block, there is no transfer of motion of the locking element to the lever element. Advantageously, this can be done in such a way that, on the one hand, the locking element is automatically brought into a locking position during the insertion process, i.e., without manual turning of the grip piece, for example by the presence of rollers. At the same time, this configuration has the advantage that no awkward turning of the grip piece occurs during the insertion of the test plug block.

In addition, it is advantageous when the receiving area of the lever element has at least one limiting element, wherein the limiting element limits the motion of the locking element during the insertion process. According to an especially simple configuration, the limiting element is configured as a stop surface.

It is especially preferred when the locking element has a first steering element which, together with a second steering element in the clamp housing of the at least one fastening element, guides the locking element into the first locking position during the insertion process. Preferably, the first steering element and the second steering element are configured as rollers. According to one configuration, the second connecting element that is arranged in the clamp housing is configured at the same time as a second steering element. Preferably, in this respect, one side of the second connecting element that is configured as a locking projection or as a locking hook is designed as a roller.

According to a next configuration, the first connecting element and the stop surface of the locking element are arranged offset from one another in the longitudinal direction and/or crosswise to the longitudinal direction of the locking element.

According to a next configuration, at least one spring element is arranged in the housing of at least one fastening part in such a way that the lever element is brought into its basic position when the grip piece is not actuated. In this case, the basic position of the lever element corresponds to the position in which the locking element is also arranged in the basic position. It is especially preferred when at least two spring elements are present that engage the lever element one behind another in the longitudinal direction. In this way, a canting of the lever element can be avoided in an especially simple way. The spring element can be configured as, for example, a compression spring or a tension spring or a leaf spring.

An especially simple option for transferring the rotational motion of the grip piece into a motion of the lever element or the locking element is provided in that the grip piece is connected to the lever element preferably via at least one gear, wherein the at least one gear engages with one side of the lever element. To this end, on one side, the lever element preferably also has multiple teeth, which work together with the teeth of at least one gear.

According to a second teaching of this invention, the object that was mentioned in the beginning is achieved by a test terminal block that was described in the beginning in that a locking element is arranged in the insertion section of at least one fastening part, in that the locking element can be brought from a basic position into an unlocking position by turning the grip piece, in that the locking element has a first connecting element in the form of a locking hook or a locking projection, in that a corresponding second connecting element in the form of a locking projection or a locking hook is arranged in the clamp housing of the at least one fastening clamp, in that the first connecting element together with the corresponding second connecting element determines a first locking position, in that the locking element has at least one stop surface, in that the clamp housing of the fastening clamp has an opposing stop surface, and in that the stop surface together with the opposing stop surface in the unlocking position of the locking element prevents the test plug block from being pulled out.

According to an advantageous configuration of the test terminal block, the test plug block is designed according to one of the above-described configurations. It is understood that depending on the configuration of the test plug block, the series terminal block is also designed accordingly to ensure the corresponding advantages.

Especially advantageously, the test terminal block is configured in such a way that a complete unlocking of the inserted test plug block is carried out by the following sequence of movements: bringing the locking element from the basic position into the unlocking position by turning the grip piece, pulling the test plug block out to the stop of the stop surface at the opposing stop surface (second locking position), bringing the locking element from the unlocking position into the basic position, extracting the test plug block. In an especially simple way, in this respect, the test plug block, controlled in two stages, can be extracted from the series terminal block.

In particular, there are now a number of options for configuring and further developing the test plug block according to the invention and the test terminal block according to the invention. To this end, reference is made the following description of the preferred embodiments with reference to the accompanying drawings.

DETAILED DESCRIPTION OF THE INVENTION

Figure 1:
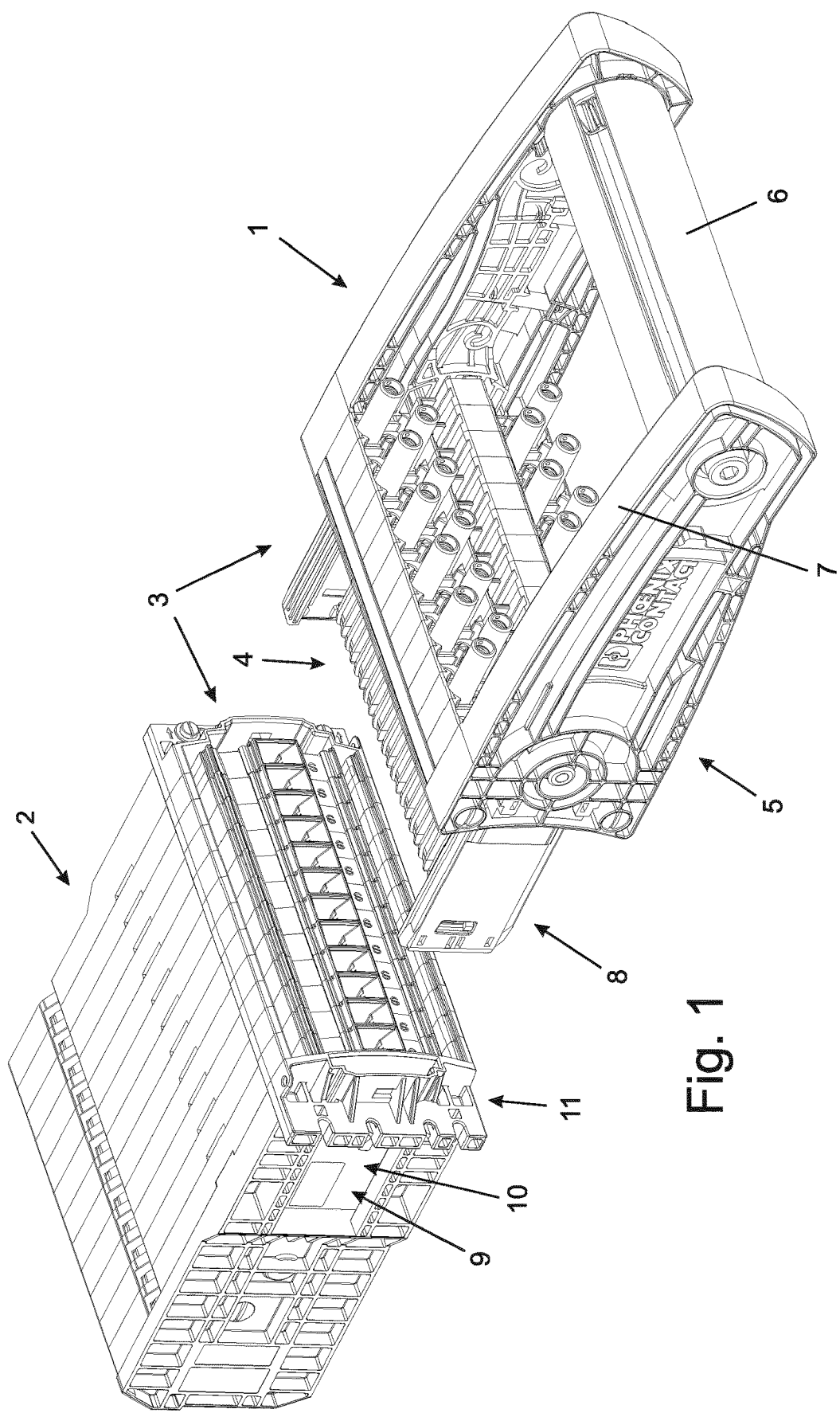
FIG. 1 shows an embodiment of a test plug block and a series terminal block.

In a perspective view, FIG. 1 shows the combination of a test plug block 1 and a series terminal block 2, which together form a test terminal block 3. The test plug block 1 is configured to plug onto the series terminal block 2. It has a number of test plugs 4 that are connected to one another and two fastening parts 5 that are arranged on both sides of the number of test plugs 4, wherein the fastening parts 5 are connected to one another via a grip piece 6. In each case, the fastening parts 5 have a housing 7 and an insertion section 8, wherein the insertion section 8 can be inserted into a receiving section 9 in the clamp housing 10 of a fastening clamp 11 of the series terminal block 2.

Figure 2:
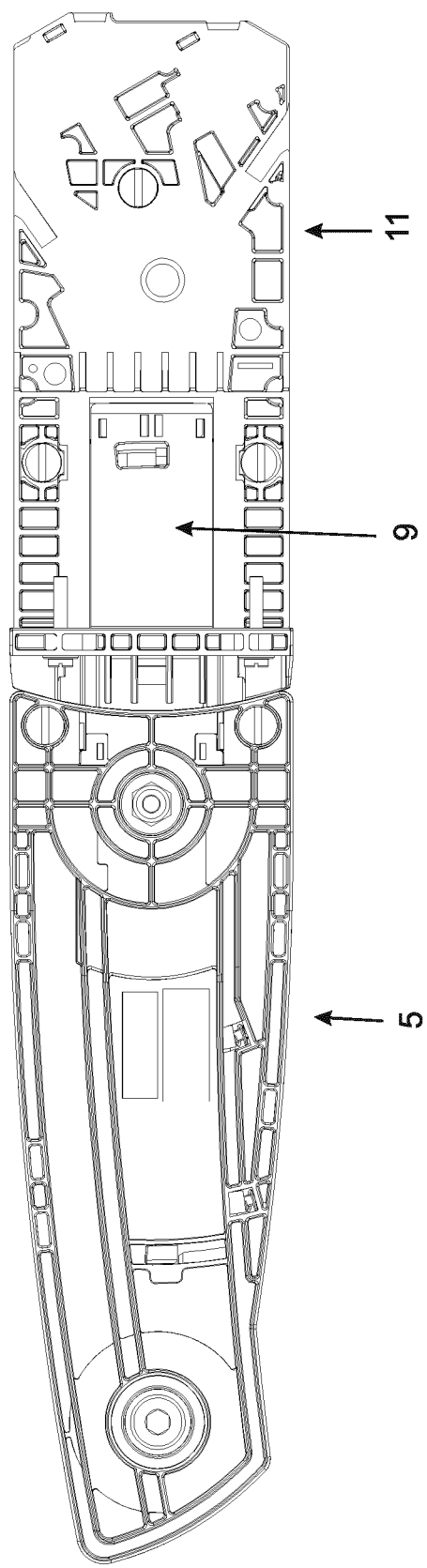
FIG. 2 shows an embodiment of a fastening part in the completely inserted state, FIG. 3.1 shows an embodiment of a fastening part of the test plug block with a grip piece, FIG. 3.2 shows an embodiment of a fastening part of the test plug block without a grip piece.

FIG. 2 shows a fastening part 5 of a test plug block 1 in the inserted state in a fastening clamp 11. In the depicted embodiment, the insertion section 8 of the fastening part 5 is inserted completely into the receiving section 9 of the fastening clamp 11. The system that consists of the fastening part 5 and the fastening clamp 11 is in a first locking state, i.e., the test plug block 1 cannot be easily extracted.

Figure 3:
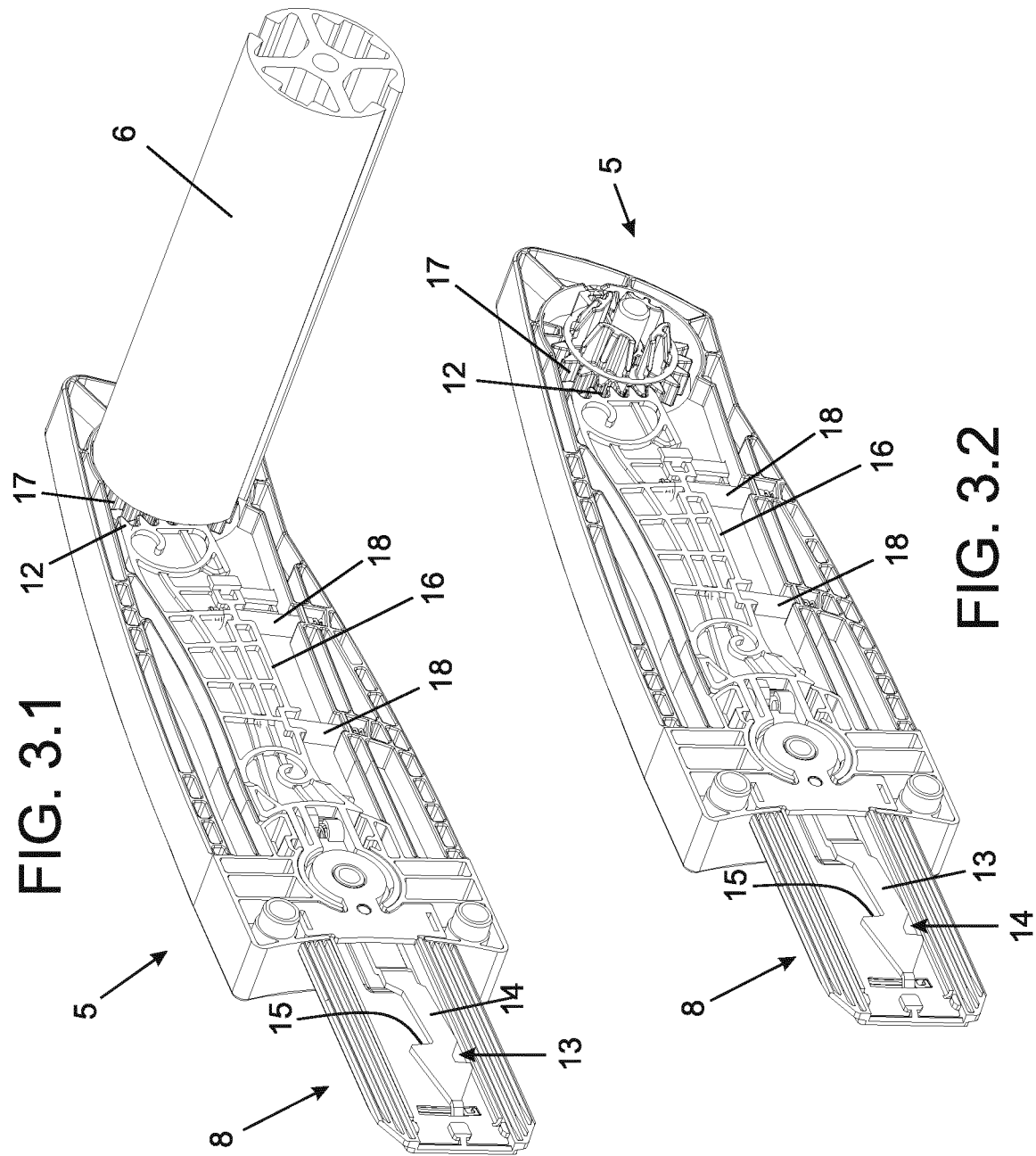

FIG. 3.1 shows an embodiment of a fastening part 5 together with a grip piece 6. In the insertion section 8 of the fastening part 5, a locking element 13 is arranged, which locking element can be brought from a basic position into an unlocking position by turning the grip piece 6. The basic position of the locking element 13 is shown. To produce a lock between the test plug block 1 and the series terminal block 2, the locking element 13 has a first connecting element in the form of a locking hook 14, which together with a corresponding locking projection 21 in the clamp housing 10 of the fastening clamp 11 determines a first locking position. In addition, the locking element 13 has a stop surface 15, which together with an opposing stop surface 22 in the clamp housing 10 of the fastening clamp 11 in the unlocking position of the locking element 13 prevents the test plug block 1 from being pulled out and in this respect determines a second locking position.

The locking element 13 is connected to a lever element 16, wherein the lever element 16 in turn is connected via a gear 17 to the grip piece 6. To this end, the lever element 16 has a number of teeth 12 that engage with the teeth of the gear 17.

A turning of the grip piece 6 produces a turning of the gear 17, by which the lever element 16 in the depicted embodiment is moved downward. The lever element 16 and the locking element 13 are connected to one another in such a way that there is a transfer of motion of the lever element 16 to the locking element 13, so that the locking element 13 can be brought from the basic position into the unlocking position.

In addition, in the depicted embodiment, spring elements 18 are present, which press the lever element 16 into the depicted basic position of the lever element 16.

In FIG. 3.2, the embodiment of the fastening part 5 that is shown in FIG. 3.1 is shown without the grip piece 6.

Figure 4:
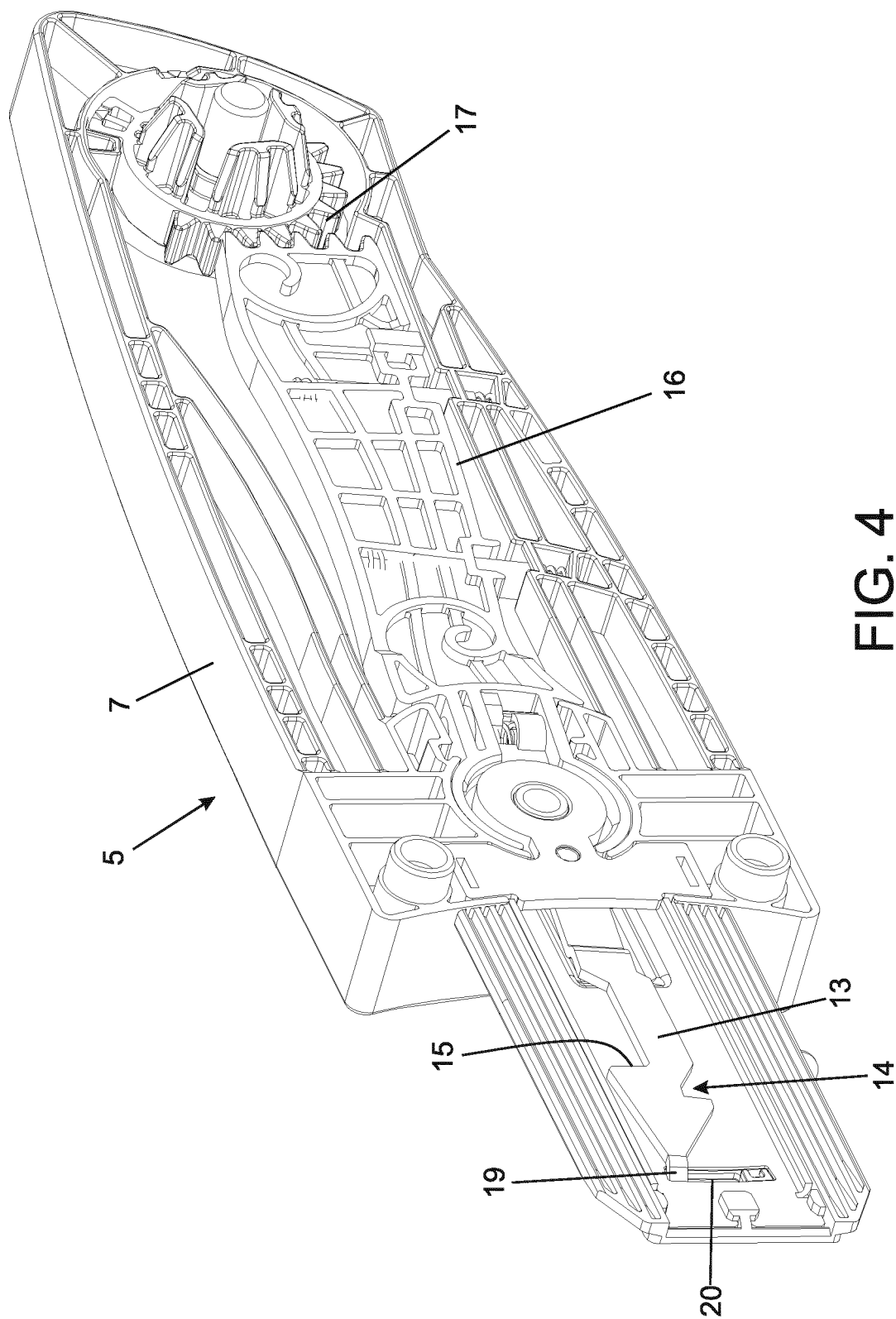
FIG. 4 shows an embodiment of a fastening part of the test plug block.

FIG. 4 shows an embodiment of a fastening part 5 in a state in which by the turning of the gear 17, the lever element 16 is deflected by the grip piece 6, not shown, in such a way that the locking element 13 is in the unlocking position.

The depicted locking element 13 has a guiding projection 19 on the side facing away from the housing 7. In addition, the insertion section 8 has a guiding surface 20 in the form of a groove, wherein the guiding projection 19 is arranged to move in the guiding surface 20. This arrangement limits the motion of the locking element 13 in the area between the basic position and the unlocking position, wherein the stop of the guiding projection 19 at the lower edge of the guiding surface 20 corresponds to the basic position of the locking element 13, and wherein the stop of the guiding projection 19 at the upper edge of the guiding surface corresponds to the unlocking position of the locking element 13.

The subsequent FIGS. 5 to 8 show the individual steps or states in the course of an unlocking process.

Figure 5:
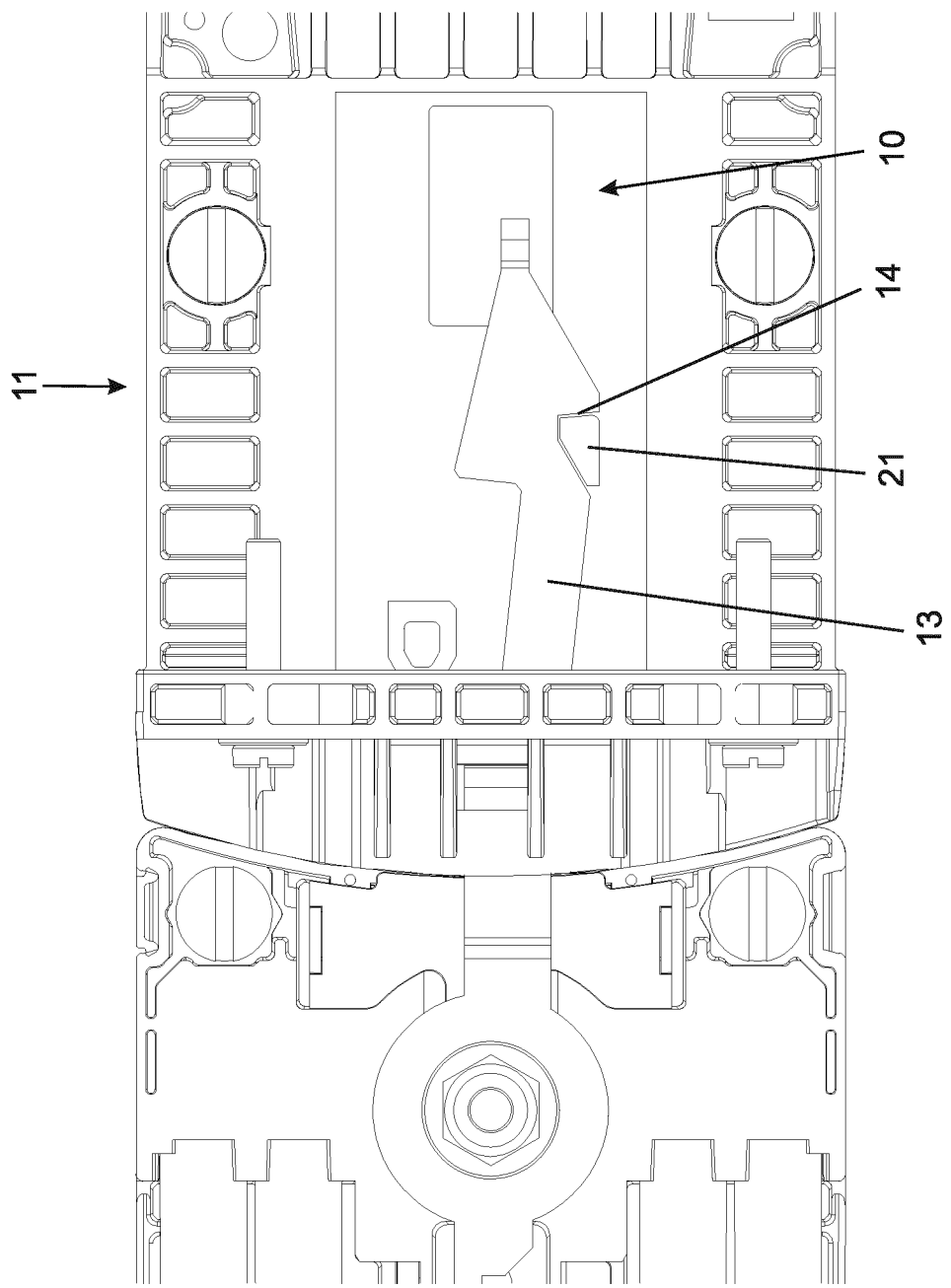
FIG. 5 shows an embodiment of a locking element in the basic position in the first locking state.

FIG. 5 shows an embodiment of a locking element 13 in the basic position. The locking element 13 has a locking hook 14, which with the locking projection 21 in the clamp housing 10 of the fastening clamp 11 determines a first locking position. This state corresponds to the situation that the test plug block 1 is completely inserted into the series terminal block.

Figure 6:
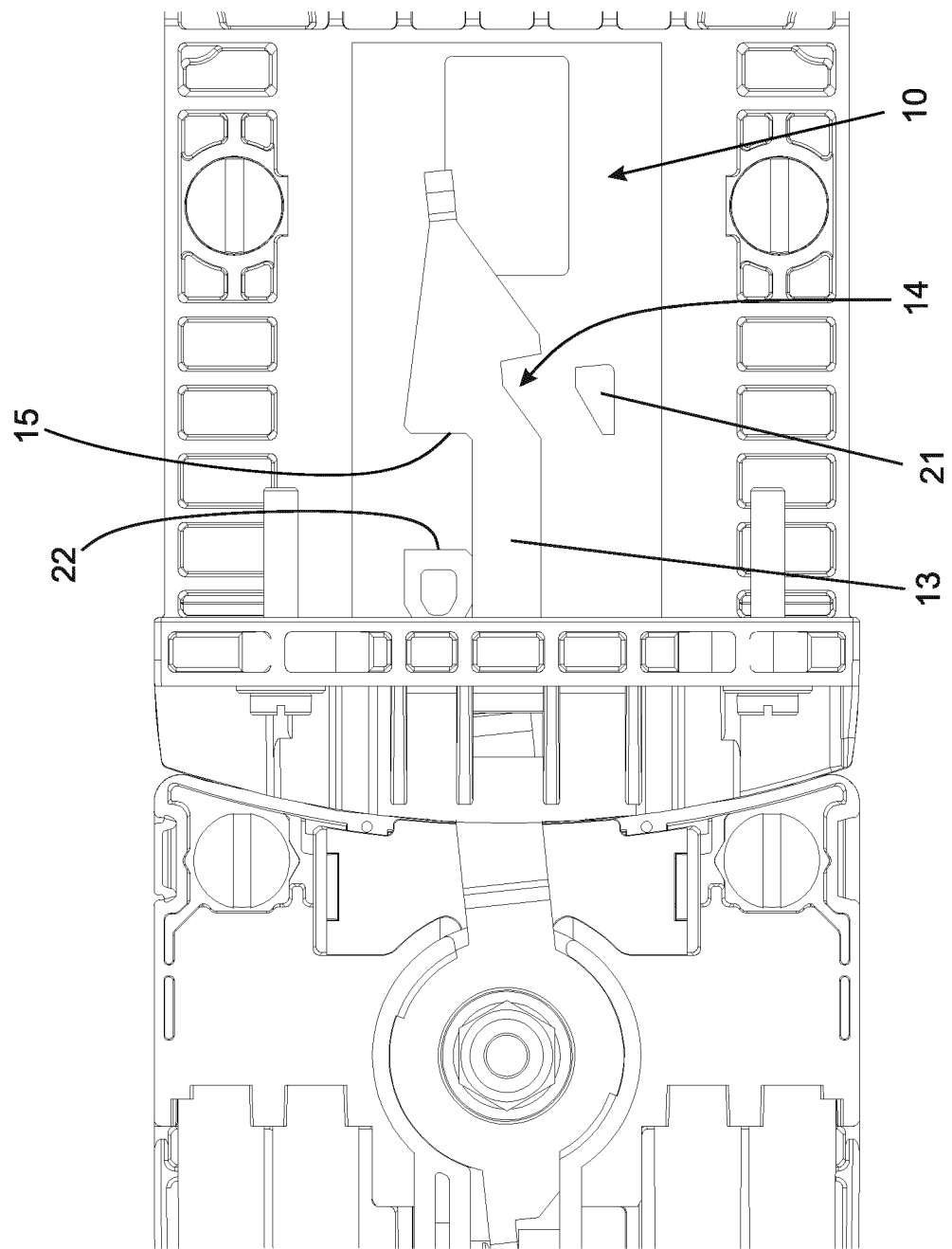
FIG. 6 shows an embodiment of a locking element in the unlocking position in the released state.

To release this first locking position, the locking element 13 is brought into an unlocking position by turning the grip piece 6, as shown in FIG. 6. In this unlocking position, the locking hook 14 no longer works together with the locking projection 21. It is now possible to pull the test plug block 1 out to the stop of the stop surface 15 of the locking element 13 at the opposing stop surface 22 in the clamp housing 10 of the fastening clamp 11.

Figure 7:
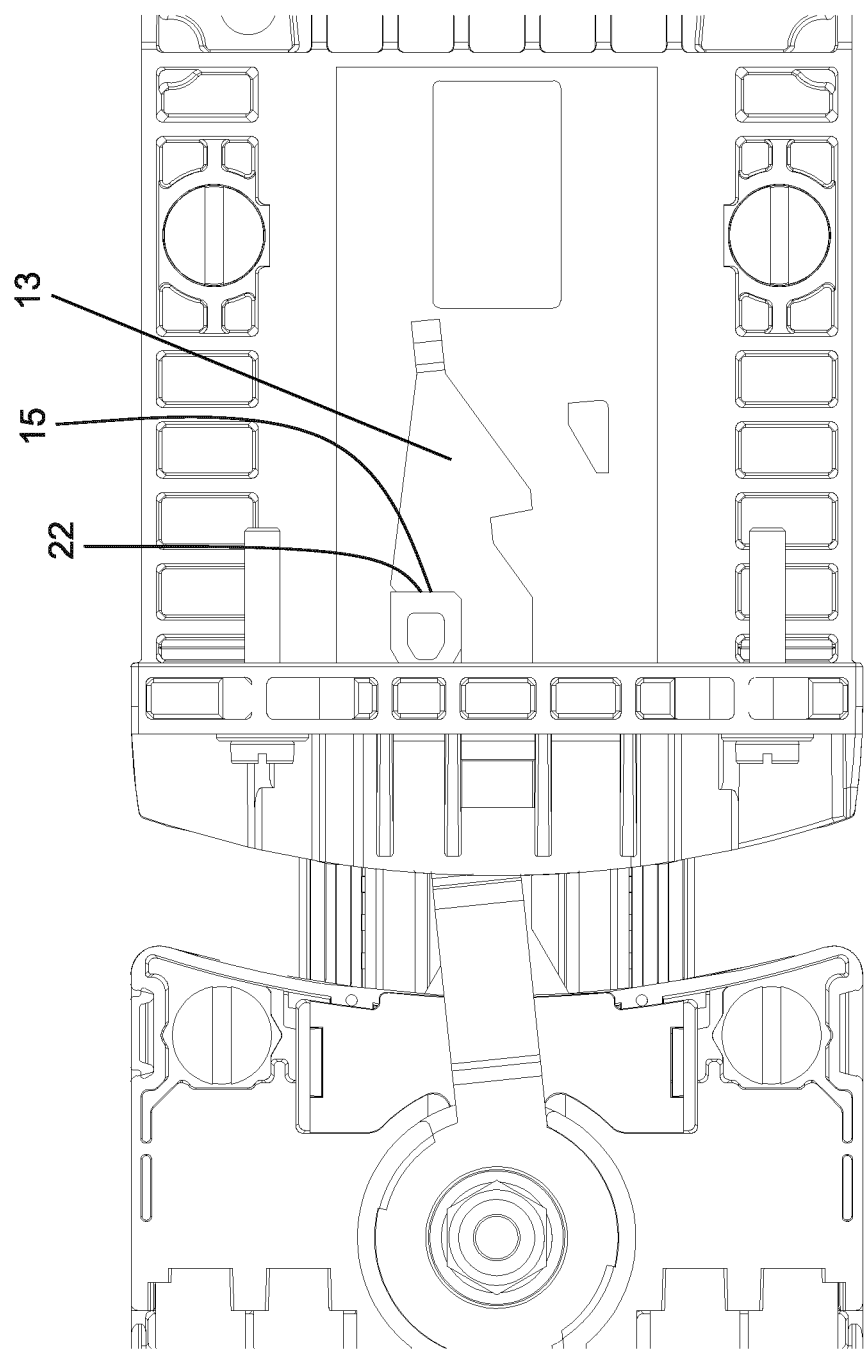
FIG. 7 shows an embodiment of a locking element in the unlocking position in the second locking state.

This is shown in FIG. 7. The stop of the stop surface 15 at the opposing stop surface 22 produces a second locking position, in which the test plug block 1 cannot be easily extracted.

Figure 8:
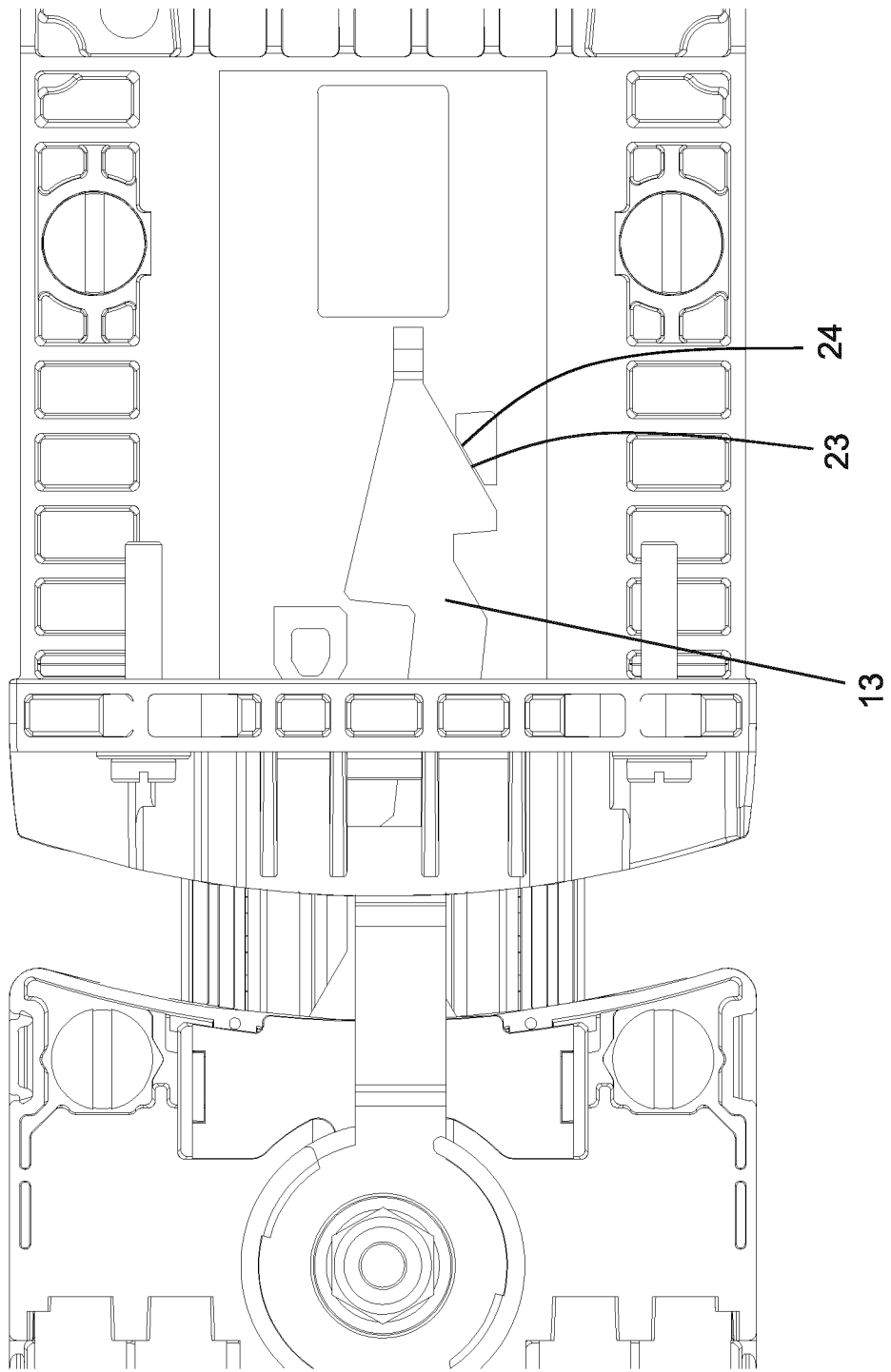
FIG. 8 shows an embodiment of a locking element in the basic position, which does not produce a locking state.

To release the second locking position, the locking element 13 is now brought again into the basic position, by which any interaction of the stop surface 15 with the opposing stop surface 22 is eliminated. This is shown in FIG. 8. In addition, FIG. 8 shows that the locking element 13 has another stop surface 23, which together with another opposing stop surface 24 in the clamp housing 10 of the fastening clamp 11 ensures that the motion of the locking element 13 does not go beyond the basic position. In the depicted embodiment, the additional stop surface 24 is produced by the locking projection 21. A complete extraction of the test plug block 1 is now possible.

In addition, in the depicted embodiment, with regard to the opposite process of the insertion of the test plug block 1, both the stop surface 23 and the opposing stop surface 24 are configured as rollers, via which with the insertion process, the locking element 13 can be brought into the first locking position. In the depicted configuration, the second connecting element in the form of the locking projection 21 thus comprises both an opposing stop surface 24 for limiting the motion of the locking element 13 and a second steering element in the form of a roller, wherein in this case, the opposing stop surface 24 is configured as a roller. The same applies for the configuration of the stop surface 23 of the locking element 13 as a roller.

An insertion of the test plug block 1 into the series terminal block 2 can thus be carried out in the basic position of the locking element 13. If the connection between the lever element 16 and the locking element 13 in addition is configured in such a way that the locking element 13 has a range of motion, there is no transfer of motion of the locking element 13 to the lever element 16 and thus there is also no transfer to the grip piece 6 during insertion.

Figure 9:
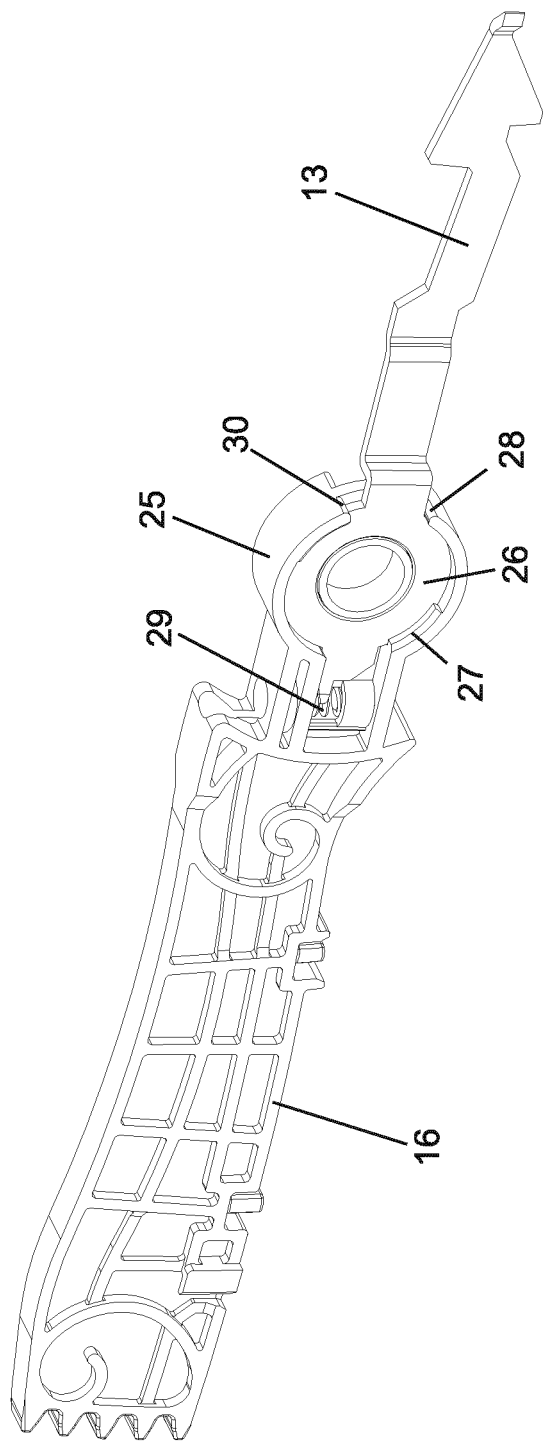
FIG. 9 shows the connection of a lever element to a locking element.

FIG. 9 shows an embodiment of a connection of a lever element 16 to a locking element 13. The lever element 16 has a rotationally-symmetrical circular receiving area 25, in which the rotationally-symmetrical circular fastening area 26 of the locking element 13 is arranged. The fastening area 26 of the locking element 13 is held in the receiving area 25 of the lever element 16 by means of latching catches 27. The circular fastening area 26 is arranged in the circular receiving area 25 in such a way that the two areas 25, 26 have a common axis of rotation. As a result, the lever element 16 and the locking element 13 thus are arranged to turn relative to one another, so that motion of the locking element 13 can also occur independently of the lever element 16.

In addition, the lever element 16 in the receiving area 25 has a guide element 28, wherein the guide element 28 works together with the locking element 13 in such a way that when the lever element 16 is moved, the locking element 13 can be brought from the basic position into the unlocking position by the grip piece 6 being turned by the guide element 28. In the depicted embodiment, the guide element 28 is designed as a stop.

To ensure that the locking element 13 is always brought back into the basic position after force is applied, a spring element 29 is arranged between the locking element 13 and the lever element 16. In the depicted embodiment, the spring element 29 is configured as a compression spring, which presses the locking element 13 into the basic position.

Moreover, the locking element 13 and the lever element 16 are connected to one another, as already stated, in such a way that the locking element 13 has a certain range of motion. This has the advantage that when the test plug block 1 is inserted into the series terminal block 2, there is no transfer of motion of the locking element 13 to the lever element 16, and thus there is also no transfer to the grip piece 6 during insertion.

To limit the range of motion, the receiving area 25 of the lever element 16 has a limiting element 30. In the depicted embodiment, the limiting element 30 is configured as a stop surface. On the other side, the motion of the locking element 13 is limited by the guide element 28.

The depicted embodiments of the test plug block 1 or the test terminal block 3 overall have the advantage that an insertion of the test plug block 1 into the series terminal block 2 up to a first locking position of the two components as well as a multi-stage extraction of the test plug block 1 from the series terminal block 2 can be carried out especially simply by a single turn of the grip piece 6. In this case, a complete unlocking of the inserted test plug block 1 is carried out by the following sequence of movements: bringing the locking element 13 from the basic position into the unlocking position by turning the grip piece 6, pulling the test plug block 1 out to the stop of the stop surface 15 at the opposing stop surface 22 (second locking position), bringing the locking element 13 from the unlocking position into the basic position, extracting the test plug block 1.

What is claimed is:

1. A test plug block for plugging onto a series terminal block, comprising:

a plurality of test plugs that are connected to one another and two fastening parts each of which is arranged on a respective side of the plurality of test plugs, the fastening parts being connected to one another via a grip piece, wherein each of the fastening parts has a housing and an insertion section, which is insertable into a receiving section formed in a clamp housing of a fastening clamp of the series terminal block, wherein a locking element is arranged in the insertion section of at least one of the fastening parts, wherein the locking element is movable from a basic position into an unlocking position by turning of the grip piece, wherein the locking element has a first connecting element in the form of a locking hook or a locking projection, wherein the first connecting element together with a corresponding second connecting element in the form of a locking projection or a locking hook in the clamp housing of the at least one fastening clamp determines a first locking position, wherein the locking element has at least one stop surface which, together with an opposing stop surface in the clamp housing of the at least one fastening clamp, prevents the test plug block from being pulled out in the unlocking position of the locking element.

2. The test plug block according to claim 1, wherein the locking element has at least one additional stop surface, which together with another opposing stop surface in the clamp housing of the fastening clamp ensures that the motion of the locking element does not go beyond the basic position.

3. The test plug block according to claim 1, wherein the locking element on a side that faces away from the housing has a guiding projection and wherein the insertion section has a guiding surface, wherein the guiding projection is arranged to move in the guiding surface, so that the guiding surface limits the motion of the locking element to an area between the basic position and the unlocking position and/or the locking element is kept in position by means of the guiding projection and the guiding surface.

4. The test plug block according to claim 1, wherein a lever element is arranged in the housing of the at least one fastening part, wherein the lever element is connected to the locking element, and wherein the locking element is movable from the basic position into the unlocking position by the grip piece being turned by the lever element.

5. The test plug block according to claim 4, wherein the lever element and the locking element are arranged to turn relative to one another and wherein the lever element has a guide element, wherein when the lever element is moved by the grip piece being turned, the locking element is movable from the basic position into the unlocking position by the guide element.

6. The test plug block according to claim 4, wherein the lever element has a rotationally-symmetrical receiving area, wherein the locking element has a rotationally-symmetrical fastening area arranged in a receiving area of the lever element, wherein the fastening area of the locking element in the receiving area of the lever element is held by means of at least one latching catch.

7. The test plug block according to claim 4, wherein a spring element is arranged between the locking element and the lever element in such a way that the locking element is brought by the force of the spring into the basic position when the grip piece is unactuated and/or the test plug block is completely inserted, so that the locking element is arranged in the first locking position.

8. The test plug block according to claim 4, wherein the locking element and the lever element are connected to one another in such a way that the locking element has a range of motion so that during the insertion process of the test plug block, no motion from the locking element is transferred to the lever element.

9. The test plug block according to claim 6, wherein the receiving area has at least one limiting element, wherein the limiting element limits the motion of the locking element during the insertion process.

10. The test plug block according to claim 1, wherein the locking element has a first steering element which, together with a second steering element in the clamp housing of the at least one fastening clamp, guides the locking element into the first locking position during insertion.

11. The test plug block according to claim 1, wherein the first connecting element and the stop surface are arranged offset relative to one another in a longitudinal direction and/or crosswise to the longitudinal direction of the locking element.

12. The test plug block according to claim 1, wherein at least one spring element is arranged in the housing of the at least one fastening part in such a way that the lever element is brought into its basic position when the grip piece is unactuated.

13. The test plug block according to claim 1, wherein the grip piece is connected to the lever element via at least one gear, and wherein the at least one gear engages with one side of the lever element.

14. A test terminal block, comprising:
a series terminal block and
a test plug block that can be plugged onto the series terminal block,
wherein the series terminal block has a plurality of series terminals that are arranged one next to the other with a respective fastening clamp on each side of the plurality of series terminals,
wherein the test plug block has a plurality of test plugs that are connected to one another with a respective fastening part on each side of the plurality of test plugs, wherein the fastening parts are connected to one another via a grip piece, wherein each of the fastening parts has a housing and an insertion section which can be inserted into a receiving section,
wherein the receiving section is formed in a clamp housing of a fastening clamp of the series terminal block,
wherein a locking element is arranged in the insertion section of at least one fastening part,
wherein the locking element is movable from a basic position into an unlocking position by turning the grip piece,
wherein the locking element has a first connecting element in the form of a locking hook or a locking projection,
wherein a corresponding second connecting element in the form of a locking projection or a locking hook is arranged in the clamp housing of the at least one fastening clamp,
wherein the first connecting element together with the corresponding second connecting element determines a first locking position,
wherein the locking element has at least one stop surface, wherein the clamp housing of the fastening clamp has an opposing stop surface, and wherein the stop surface together with the opposing stop surface prevents the test plug block from being pulled out in the unlocking position.

15. The test terminal block according to claim 14, wherein a lever element is arranged in the housing of the at least one fastening part, wherein the lever element is connected to the locking element, and wherein the locking element is movable from the basic position into the unlocking position by the grip piece being turned by the lever element.

16. The test terminal block according to claim 14, wherein the test terminal block is configured in such a way that a complete unlocking of the inserted test plug block is achievable by the following sequence of movements: bringing the locking element from the basic position into the unlocking position by turning the grip piece, pulling the test plug block out to the stop of the stop surface at the opposing stop surface, bringing the locking element from the unlocking position into the basic position, extracting the test plug block.

* * * * *